(12) United States Patent
Bryant

(10) Patent No.: US 8,492,074 B2
(45) Date of Patent: Jul. 23, 2013

(54) METHOD OF IMPROVING PRINT PERFORMANCE IN FLEXOGRAPHIC PRINTING PLATES

(76) Inventor: Laurie A. Bryant, Douglasville, GA (US)

( * ) Notice: Subject to any disclaimer, the term of this patent is extended or adjusted under 35 U.S.C. 154(b) by 272 days.

(21) Appl. No.: 12/984,699

(22) Filed: Jan. 5, 2011

(65) Prior Publication Data
US 2012/0171620 A1   Jul. 5, 2012

(51) Int. Cl.
*G03F 7/11* (2006.01)
*G03F 7/26* (2006.01)
*B41N 1/06* (2006.01)

(52) U.S. Cl.
USPC ............... 430/306; 430/271.1; 430/273.1; 101/453; 101/463.1

(58) Field of Classification Search
USPC ........................... 430/300, 302, 306
See application file for complete search history.

(56) References Cited

U.S. PATENT DOCUMENTS

| | | |
|---|---|---|
| 3,265,765 A | 8/1966 | Holden et al. |
| 3,867,153 A | 2/1975 | MacLachlan |
| 4,264,705 A | 4/1981 | Allen |
| 4,320,188 A | 3/1982 | Heinz et al. |
| 4,323,636 A | 4/1982 | Chen |
| 4,323,637 A | 4/1982 | Chen et al. |
| 4,369,246 A | 1/1983 | Chen et al. |
| 4,423,135 A | 12/1983 | Chen et al. |
| 4,427,759 A | 1/1984 | Gruetzmacher et al. |
| 4,622,088 A | 11/1986 | Min |
| 5,135,827 A | 8/1992 | Bohm et al. |
| 5,223,375 A | 6/1993 | Berrier et al. |
| 5,248,583 A | 9/1993 | Lundquist et al. |
| 5,262,275 A | 11/1993 | Fan |
| 5,529,879 A | 6/1996 | Hoshino et al. |
| 5,719,009 A | 2/1998 | Fan |
| 5,925,500 A | 7/1999 | Yang |
| 6,143,451 A | 11/2000 | Blanchet-Fincher |
| 6,238,837 B1 | 5/2001 | Fan |
| 6,558,876 B1 | 5/2003 | Fan |
| 7,041,429 B2 * | 5/2006 | Ohta et al. ................. 430/270.1 |
| 7,348,123 B2 | 3/2008 | Mengel et al. |
| 7,691,550 B2 | 4/2010 | Goldfarb |
| 8,158,331 B2 * | 4/2012 | Recchia ........................ 430/306 |
| 2005/0011382 A1 | 1/2005 | Donahue et al. |
| 2005/0227182 A1 | 10/2005 | Ali et al. |
| 2006/0127805 A1 | 6/2006 | Ali et al. |
| 2008/0305407 A1 | 12/2008 | Zwadlo et al. |
| 2008/0314271 A1 | 12/2008 | Goldfarb |
| 2009/0000735 A1 | 1/2009 | Zwadlo et al. |
| 2009/0042138 A1 | 2/2009 | Roberts et al. |
| 2010/0143840 A1 | 6/2010 | Veres et al. |
| 2011/0079158 A1 | 4/2011 | Recchia et al. |
| 2011/0081614 A1 * | 4/2011 | Recchia ........................ 430/306 |

FOREIGN PATENT DOCUMENTS

| | | |
|---|---|---|
| EP | 0 456 336 A2 | 11/1991 |
| EP | 0 640 878 A1 | 3/1995 |
| GB | 1 366 769 | 9/1974 |
| WO | WO 2009/033124 | * 3/2009 |

OTHER PUBLICATIONS

Sekisui, "Tg(Glass transition temperature)and Hydroxyl content," Sekisui Chemical Co., Ltd., 2008, p. 1.
Butvar Polyvinyl Butyral Resin Properties & Used, Solutia, Inc., Pub. No. 2008084E.
Butvar B-90, Data Sheets, Solutia, Inc.

* cited by examiner

*Primary Examiner* — Anca Eoff
(74) *Attorney, Agent, or Firm* — Carmody & Torrance LLP

(57) ABSTRACT

A method of controlling the shape of a plurality of relief dots created in a photosensitive printing blank during a digital platemaking process is provided. The photosensitive printing blank comprises a laser ablatable mask layer disposed on at least one photocurable layer. The method comprises the steps of: a) laser ablating the laser ablatable mask layer to create an in situ negative in the laser ablatable mask layer; b) applying a barrier membrane to the photosensitive printing blank; c) exposing the at least one photocurable layer to actinic radiation through the in situ negative; and d) developing the imaged and exposed photosensitive printing blank to reveal the relief image therein, said relief image comprising the plurality of relief dots.

15 Claims, 8 Drawing Sheets

METHOD OF IMPROVING PRINT PERFORMANCE IN FLEXOGRAPHIC PRINTING PLATES

FIELD OF THE INVENTION

The present invention relates generally to a method of tailoring the shape of printing dots created during the production of relief image printing plates to configure the printing dots for optimal printing on various substrates.

BACKGROUND OF THE INVENTION

Flexography is a method of printing that is commonly used for the industrial production of thousands to millions of duplicate printed images. Flexography is versatile and can be employed for printing on a variety of substrates such as paper, paperboard stock, corrugated board, films, foils and laminates. Newspapers, food packaging, and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

A typical photosensitive printing blank used to manufacture a flexographic printing plate is a multilayered article made of, in order, a backing, or support layer; one or more unexposed photocurable layers; optionally, a protective layer or slip film; and often a protective cover sheet.

The support sheet or backing layer lends support to the plate. The support sheet, or backing layer, can be formed from a transparent or opaque material such as paper, cellulose film, plastic, or metal. Preferred materials include sheets made from synthetic polymeric materials such as polyesters, polystyrene, polyolefins, polyamides, and the like. Generally, the most widely used support layer is a flexible film of polyethylene teraphthalate. The support sheet may also include an adhesive layer for more secure attachment to the photocurable layer(s). Optionally, an antihalation layer may be provided between the support layer and the one or more photocurable layers to minimize halation caused by the scattering of UV light within the non-image areas of the photocurable resin layer.

The photocurable layer(s) can include any of the known photopolymers, monomers, initiators, reactive or non-reactive diluents, fillers, and dyes. The term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material.

Preferred photocurable materials include an elastomeric compound, an ethylenically unsaturated compound having at least one terminal ethylene group, and a photoinitiator. Exemplary photocurable materials are disclosed in European Patent Application Nos. 0 456 336 A2 and 0 640 878 A1 to Goss, et al., British Patent No. 1,366,769, U.S. Pat. No. 5,223, 375 to Berrier, et al., U.S. Pat. No. 3,867,153 to, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al, U.S. Pat. No. 4,622,088 to Min, and U.S. Pat. No. 5,135,827 to Bohm, et al., the subject matter of each of which is herein incorporated by reference in its entirety. More than one photocurable layer may be used.

The photocurable materials generally cross-link (cure) and harden through radical polymerization initiated by exposure to some actinic wavelength region. As used herein, actinic radiation is radiation capable of effecting a chemical change in one or more compounds in the materials of the photocurable layer. Actinic radiation includes, for example, amplified (e.g., laser) and non-amplified light, particularly in the UV and violet wavelength regions. One commonly used source of actinic radiation is a mercury arc lamp, although other sources are generally known to those skilled in the art.

The protective layer or slip film is a thin layer that protects the photosensitive printing blank from dust and increases its ease of handling.

In a conventional ("analog") plate making process, the slip film is transparent to UV light. In this process, the printer peels the cover sheet off the printing plate blank and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file, and is used to create an in situ negative in a digital (i.e., laser ablatable) masking layer, which is typically a slip film which has been modified to include a radiation opaque material. Portions of the laser ablatable layer are ablated by exposing the masking layer to laser radiation at a selected wavelength and power of the laser. Examples of laser ablatable layers are described, for example, in U.S. Pat. No. 5,925,500 to Yang, et al., and U.S. Pat. Nos. 5,262,275 and 6,238,837 to Fan, the subject matter of each of which is herein incorporated by reference in its entirety. The plate and the in situ negative are then subjected to flood exposure by actinic radiation (e.g., UV light) through the in situ negative.

After imaging, the photosensitive printing element is developed to remove the unpolymerized portions of the layer of photocurable material and reveal the crosslinked relief image in the cured photosensitive printing element. Typical methods of development include washing with various solvents or water, often with a brush. Other possibilities for development include the use of an air knife or heat plus a blotter. The resulting surface has a relief pattern that reproduces the image to be printed and which typically includes both solid areas and patterned areas comprising a plurality of relief printing dots. After the relief image has been developed, the relief image printing element may be mounted on a press and printing commenced.

The relief image comprises a plurality of printing dots and the shape of the printing dots and the depth of the relief, among other factors, have an effect on the quality of the printed image. It can be very difficult to print small graphic elements such as fine dots, lines and even text using flexographic printing plates while maintaining open reverse text and shadows. In the lightest areas of the image (commonly referred to as highlights) the density of the image is represented by the total area of dots in a halftone screen representation of a continuous tone image. For Amplitude Modulated (AM) screening, this involves shrinking a plurality of halftone dots located on a fixed periodic grid to a very small size, the density of the highlight being represented by the area of the dots. For Frequency Modulated (FM) screening, the size of the halftone dots is generally maintained at some fixed value, and the number of randomly or pseudo-randomly placed dots represent the density of the image. In both cases, it is necessary to print very small dot sizes to adequately represent the highlight areas.

Maintaining small dots on flexographic plates can be very difficult due to the nature of the platemaking process. In digital platemaking processes that use a UV-opaque mask layer, the combination of the mask and UV exposure produces relief dots that have a generally conical shape. The smallest of these dots are prone to being removed during processing, which means no ink is transferred to these areas during printing (the dot is not "held" on plate and/or on press). Alternatively, if the printing dots survive processing, they are susceptible to damage on press. For example small dots often fold over and/or partially break off during printing, causing either excess ink or no ink to be transferred.

Finally, photocurable resin compositions typically cure through radical polymerization, upon exposure to actinic radiation. However, the curing reaction can be inhibited by molecular oxygen, which is typically dissolved in the resin compositions and present in the general environment, because the oxygen reacts with the radical-producing compounds used to initiate polymerization in the photocurable layer. It is therefore desirable for oxygen to be excluded from the resin composition during image-wise exposure so that the photocurable resin composition can be more rapidly and uniformly cured.

One method of excluding oxygen involves placing the photosensitive resin plate in an atmosphere of inert gas, such as carbon dioxide gas or nitrogen gas, before exposure in order to displace the environmental oxygen. A noted drawback to this method is that it is inconvenient and cumbersome and requires a large space for the apparatus.

Another approach involves subjecting the plates to a preliminary exposure (i.e., "bump exposure") of actinic radiation. During bump exposure, a low intensity "pre-exposure" dose of actinic radiation is used to sensitize the resin before the plate is subjected to the higher intensity main exposure dose of actinic radiation. The bump exposure is typically applied to the entire plate area and is a short, low dose exposure of the plate that reduces the concentration of oxygen, which inhibits photopolymerization of the plate (or other printing element) and aids in preserving fine features (i.e., highlight dots, fine lines, isolated dots, etc.) on the finished plate. However, the pre-sensitization step can also cause shadow tones to fill in, thereby reducing the tonal range of the halftones in the image. In the alternative, a selective preliminary exposure, as discussed for example in U.S. Patent Publication No. 2009/0043138 to Roberts et al., the subject matter of which is herein incorporated by reference in its entirety, has also been proposed. Other efforts to reduce the effects of oxygen on the photopolymerization process have involved special plate formulations alone or in combination with the bump exposure.

Finally, collimated light sources, where the collimation is achieved by optical or other mechanical means, have also been used to minimize the effect of oxygen on the photopolymerization process and alter the shape of resulting dots.

However all of these methods are still deficient in producing a relief image printing element having a superior dot structure for printing on various substrates. In addition, none of these methods allow for the dot shape to be tailored or modified in a directed fashion to satisfy the needs of the printing application.

Thus, there remains a need for an improved method of making a relief image printing element that allows for the tailoring or modification of the shape and/or geometric characteristics of the relief printing dots to provide superior performance for printing on various substrates and/or under various conditions.

SUMMARY OF THE INVENTION

It is an object of the present invention to provide a method of tailoring or modifying the shape of relief printing dots in a relief image printing element for optimal printing on various substrates and/or under various conditions.

It is another object of the present invention to provide an improved method of creating a relief image printing element having tailored relief dots in terms of edge definition, shoulder angle, and/or print surface.

To that end, the present invention relates generally to a method of tailoring the shape of a plurality of relief printing dots created in a photosensitive printing blank during a digital platemaking process, said photosensitive printing blank comprising a laser ablatable mask layer disposed, directly or indirectly, on at least one photocurable layer, the method comprising the steps of:

a) laser ablating the laser ablatable mask layer to create an in situ negative in the laser ablatable mask layer;

b) applying a barrier membrane to the photosensitive printing blank;

c) exposing the at least one photocurable layer to actinic radiation through the in situ negative; and d) developing the imaged and exposed photosensitive printing blank to reveal the relief image therein, said relief image comprising the plurality of relief printing dots;

wherein the presence of the barrier membrane produces printing dots having at least one geometric characteristic selected from the group consisting of a desired planarity of a top surface of the printing dots, a desired shoulder angle of the printing dots and a desired edge sharpness of the printing dots.

In another preferred embodiment, the present invention relates generally to a plurality of relief printing dots created in a relief image printing element and forming a relief pattern, wherein said plurality of relief printing dots are created during a digital platemaking process and have at least one geometric characteristic selected from the group consisting of a desired planarity of a top surface of the printing dots, a desired shoulder angle of the printing dots and a desired edge sharpness of the printing dots.

BRIEF DESCRIPTION OF THE DRAWINGS

For a fuller understanding of the invention, reference is had to the following description taken in connection with the accompanying figures, in which.

DETAILED DESCRIPTION OF THE INVENTION

Figure 1:
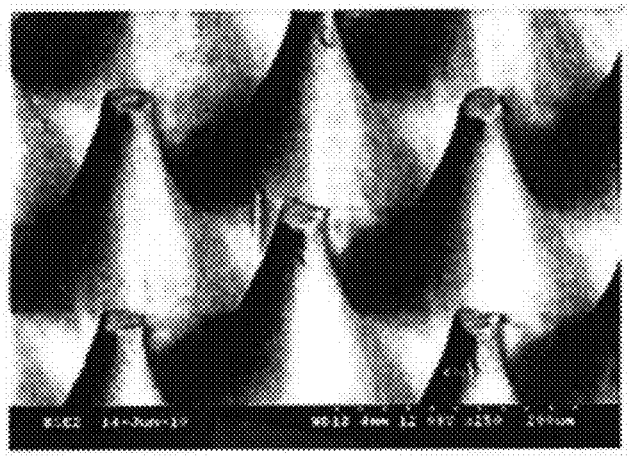
FIG. 1 depicts a scanning electron microscope (SEM) photograph of dots processed with a barrier layer in accordance with the present invention comprising 100% polyvinyl butyral resin (Butvar® B-90, available from Solutia, Inc.).

The inventors of the present invention have found that the shape and structure of the printing dots in a relief image printing element has a profound impact on the way the relief image printing element prints. The inventors of the present invention have found that the shape of the printing dot may be altered or tailored by altering the type of resins and/or the ratio of the various resins that make up the composition of an oxygen barrier membrane that is applied to a photosensitive printing blank prior to imaging, exposing and developing the photosensitive printing blank to produce the relief image printing plate.

In a preferred embodiment, the present invention relates generally to a method of controlling the shape of a plurality of relief dots created in a photosensitive printing blank during a digital platemaking process, said photosensitive printing blank comprising a laser ablatable mask layer disposed on at least one photocurable layer, the method comprising the steps of:

a) laser ablating the laser ablatable mask layer to create an in situ negative in the laser ablatable mask layer;

b) applying a barrier membrane to the photosensitive printing blank wherein the barrier membrane comprises at least two resins;

c) exposing the at least one photocurable layer to actinic radiation through the in situ negative; and d) developing the imaged and exposed photosensitive printing blank to reveal the relief image therein, said relief image comprising the plurality of relief dots;

wherein the presence of the barrier membrane produces printing dots having at least one geometric characteristic selected from the group consisting of a desired planarity of a top surface of the printing dots, a desired shoulder angle of the printing dots and a desired edge sharpness of the printing dots and wherein the foregoing steps do not need to be performed in the stated order.

The inventors of the present invention have determined that thin barrier membranes having various chemistries can produce relief printing dots having a variety of desired dot shapes and degrees of edge sharpness.

In particular, the inventors of the present invention have found that the specific type and/or ratio of resins used in the thin barrier membrane have a profound impact on the shape of the dot thus produced. For example, the use of a polyvinylpyrrolidone resin or shellac resin in the thin membrane layer results in printing dots having a very sharp edge (ie. an $r_e$:p of less than 5%) but with fairly broad shoulders (ie, a dot shoulder angle of from 30° to 50°). On the other hand, the use of a polyvinyl butyral resin in the thin barrier membrane results in printing dots having a very nice columnar shape (ie. a shoulder angle of 50° to 80°) but that lack the desired edge definition (ie. an $r_e$:p of more than 5%).

Thus, by combining a polyvinylpyrrolidone and/or shellac resin with a polyvinyl butyral resin in various concentrations, the inventors of the present invention have found that it is possible to target specific desirable geometric characteristics of the shape of the dot, including for example, planarity of the top surface of the dots, shoulder angle of the dots and edge sharpness of the dots and to produce a barrier membrane that is capable of producing the desired geometric characteristics in a repeatable fashion. Thus, the process of the invention provides a method of creating printing dots having a desired shape by the use of barrier membranes that comprises a particular blend of resin and a particular ratio of the various resins that make up the barrier membrane. The use of the barrier membranes described herein makes it possible to generate a variety of different dot shapes and to control the dot shape in a directed fashion by changing the ratio of components in the membrane.

As discussed above, the presence of the barrier membrane as described herein produces printing dots having at least one geometric characteristic selected from the group consisting of a desired planarity of a top surface of the printing dots, a desired shoulder angle of the printing dots and a desired edge sharpness of the printing dots.

Figure 9:
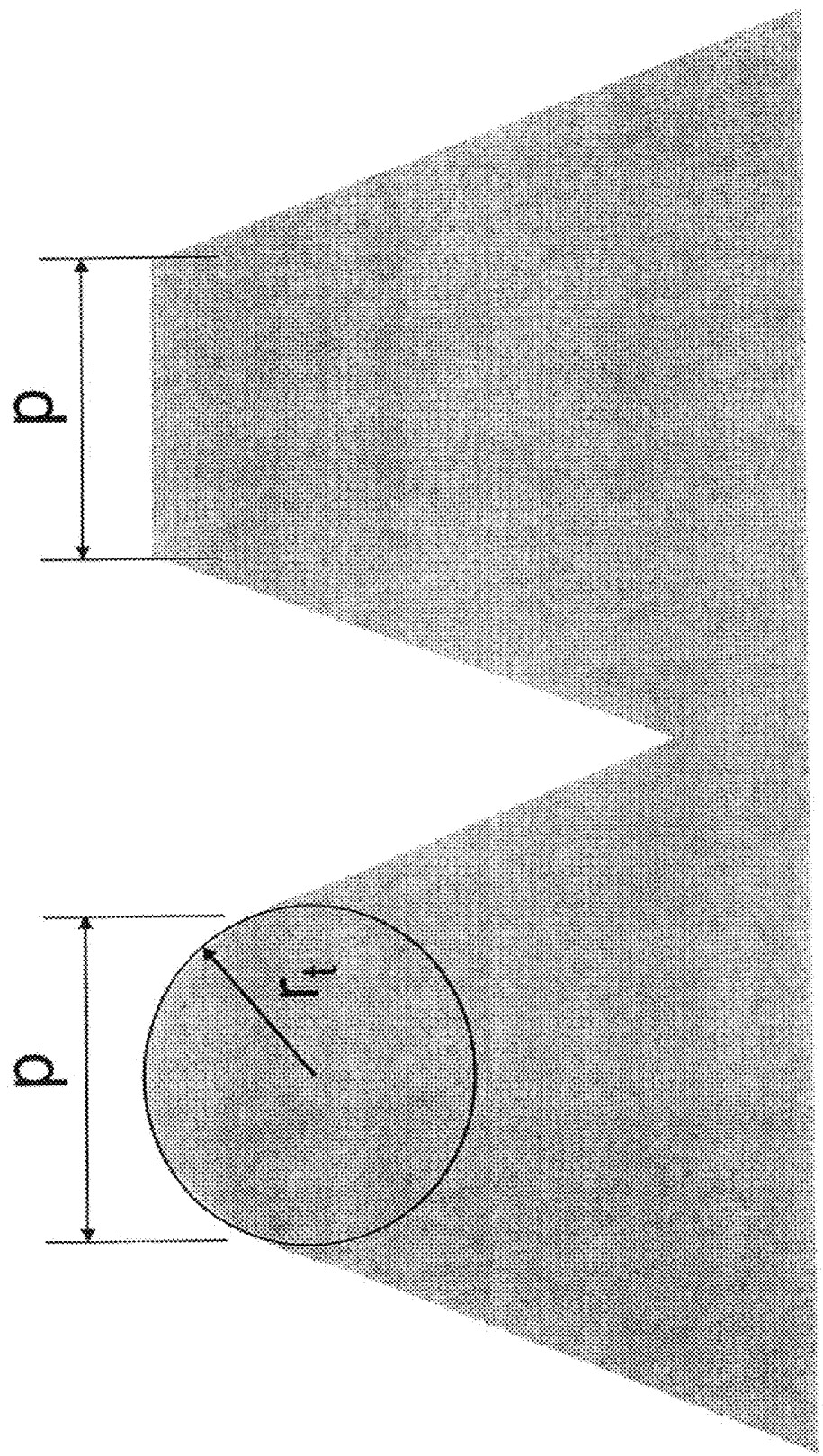
FIG. 9 describes a means of characterizing the planarity of a dot's printing surface where p is the distance across the dot top, and $r_t$ is the radius of curvature across the surface of the dot.

The planarity of the top of a dot can be measured as the radius of curvature across the top surface of the dot, $r_t$, as shown in FIG. 9. It is noted that a rounded dot surface is not ideal from a printing perspective because the size of the contact patch between the print surface and the dot varies exponentially with impression force. Therefore, the top of the dot preferably has a planarity where the radius of curvature of the dot top is greater than the thickness of the photopolymer layer, more preferably twice the thickness of the photopolymer layer, and most preferably more than three times the total thickness of the photopolymer layer.

Figure 8:
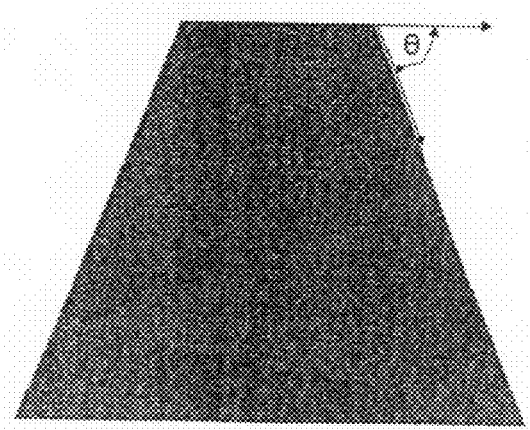
FIG. 8 depicts the measurement of the dot shoulder angle θ.

The angle of the dot shoulder is defined as shown in FIG. 8 as the angle θ formed by the dot's top and side. At the extreme, a vertical column would have a 90° shoulder angle, but in practice most flexo dots have an angle that is considerably lower, often nearer 45° than 90°.

The shoulder angle can vary depending on the size of the dots as well. Small dots, for example in the 1-15% range, may have large shoulder angles, while larger dots, for example greater than about 15% dots may exhibit smaller shoulder angles. It is desirable for all dots to have the largest shoulder angle possible.

There are two competing geometric constraints on shoulder angle—dot stability and impression sensitivity. A large shoulder angle minimizes impression sensitivity and gives the widest operating window on press, but at the expense of dot stability and durability. In contrast, a lower shoulder angle improves dot stability but makes the dot more sensitive to impression on press. In practice today, most dots are formed in such a way as to have an angle that represents a compromise between these two needs.

A dot shoulder angle of >50° is preferred throughout the tonal range. As used herein, dot shoulder angle means the angle formed by the intersection of a horizontal line tangential to the top of the dot and a line representing the adjacent dot side wall as shown in FIG. 8.

Figure 10:
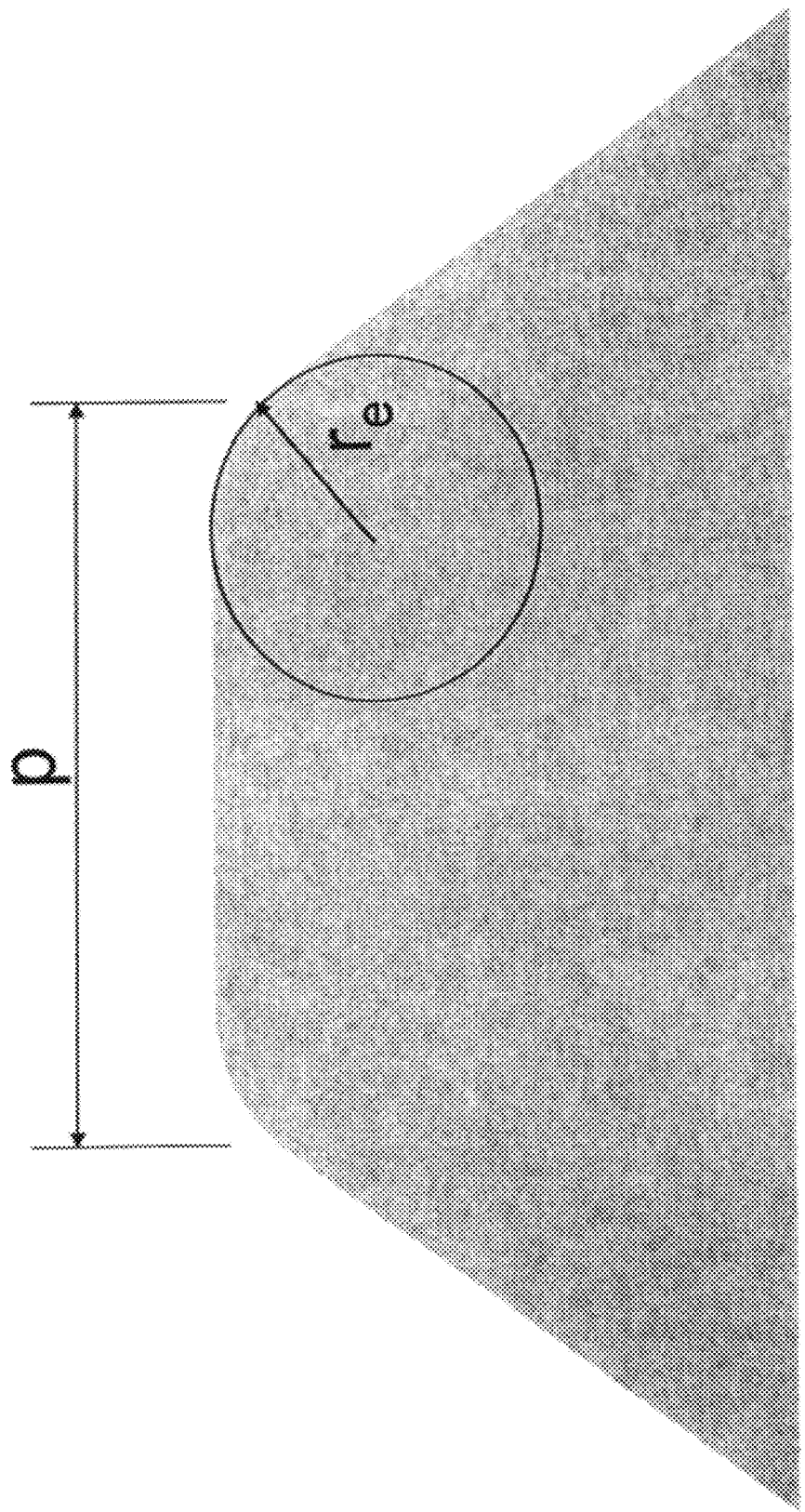
FIG. 10 depicts a flexo dot and its edge, where p is the distance across the dot top. This is used in the characterization of edge sharpness, $r_e$:p, where $r_e$ is the radius of curvature at the intersection of the shoulder and the top of the dot.

Edge sharpness relates to the presence of a well-defined boundary between the planar dot top and the shoulder and it is generally preferred that the dot edges be sharp and defined, as shown in FIG. 10. These well-defined dot edges better separate the "printing" portion from the "support" portion of the dot, allowing for a more consistent contact area between the dot and the substrate during printing.

Edge sharpness can be defined as the ratio of $r_e$, the radius of curvature (at the intersection of the shoulder and the top of the (lot) to p, the width of the dot's top or printing surface, as shown in FIG. 9. For a truly round-tipped dot, it is difficult to define the exact printing surface because there is not really an edge in the commonly understood sense, and the ratio of $r_e$:p can approach 50%. In contrast, a sharp-edged dot would have a very small value of $r_e$, and $r_e$:p would approach zero. In practice, an $r_e$:p of less than 5% is preferred, with an $r_e$:p of less than 2% being most preferred. FIG. 10 depicts a flexo dot and its edge, where p is the distance across the dot top and demonstrates the characterization of edge sharpness, $r_e$:p, where $r_e$ is the radius of curvature at the intersection of the shoulder and the top of the dot.

The barrier membrane described herein can be used in several configurations. In one preferred embodiment, the barrier membrane is laminated to the laser ablatable mask layer after the in situ negative has been created therein. Thereafter, the at least one photocurable layer is exposed to actinic radiation through the in situ negative. In another preferred embodiment, the barrier membrane is applied to the at least one photocurable layer and the laser ablatable mask layer is deposited thereon. Thereafter, the laser ablatable mask layer is laser ablated to create the in situ negative in the laser ablatable layer and the at least one photocurable layer is exposed to actinic radiation through the in situ negative. When the phrase, "applying (including laminating) a barrier membrane to the photosensitive printing blank" is used, this comprises both applying the barrier membrane directly or indirectly to the ablatable mask layer or to the photocurable layer.

As compared with the use of collimated light source, the process described herein requires no special optical or mechanical equipment for UV exposure and can generate a wider range of dot geometries without negative side effects such as poor edge-to-edge exposure uniformity, high power consumption and heat buildup. In addition, as compared with exposing the printing plate in an atmosphere modified to change the oxygen concentration, the present invention has the advantage in that it does not require the use of inert gases, gas control machinery or enclosed exposure systems. In contrast, the process described herein allows one to produce a continuously variable range of dot shapes through simple chemical changes in the membrane layer.

Furthermore, while combinations of polyvinylpyrrolidone resin and/or shellac resin with a polyvinyl butyral resin have been found to produce a good result, other similar resins that can be used to produce a barrier having similar barrier and optical properties may be used in the practice of the invention, such as polyamides, polystyrenes, polyvinyl alcohols, polyvinylidene chloride polymers, vinyl chloride copolymers hydroxyalkyl cellulose, copolymers of ethylene and vinyl acetate, amphoteric interpolymers, cellulose acetate butyrate, alkyl cellulose, butyral, and cyclic rubbers. Other important properties of the components usable in the practice of the invention, include, for example, solubility, adhesion, flexural integrity, etc., by way of example and not limitation. Based thereon, other combinations of resins, including synthetic and bio-based materials, are believed to yield a desired result and to provide superior printing performance.

In addition, while a variety of polyvinyl butyral resins are known, one exemplary polyvinyl butyral resin is BUTVAR B-90 (available from Solutia, Inc) and in a preferred embodiment, the polyvinyl butyral resin has a molecular weight of between about 70,000 and 100,000, a hydroxyl content of 18 to 21.5%, more preferably about 18.5 to about 20.5% expressed as a % of polyvinyl alcohol, a glass transition temperature of between about 72 to 78° C., and a flexural strength yield of 1,100-1,200 psi.

The barrier membrane may also include additional components other that the resins listed above, including for example, co-polymers, plasticizers, tackifying compounds, roughening agents, dyes, and other optical property modifiers as would generally be known to one skilled in the art.

As discussed above, the barrier membrane preferably comprises a blend of either polyvinylpyrrolidone or shellac resin with a polyvinyl butyral resin. In one preferred embodiment a combination of shellac resin and polyvinyl butyral resin is used and the ratio of shellac resin to polyvinyl butyral resin is in the range of about 1:4.0 and 5.0:1, preferably in the range of about 1:4.4 to about 4.8:1. In another preferred embodiment, a combination of polyvinylpyrrolidone resin and polyvinyl butyral resin is used and the ratio of polyvinylpyrrolidone resin to polyvinyl butyral resin is in the range of about 10:1 to 1:10, preferably in the range of about 1.2:1

The qualities described herein produce effective barrier layers that are capable of limiting diffusion of oxygen into the photocurable layer during exposure to actinic radiation and also tailoring the geometric characteristics of the printing dots include optical transparency, low thickness and oxygen transport inhibition.

Oxygen transport inhibition is measure in terms of a low oxygen diffusion coefficient. The oxygen diffusion coefficient of the membrane should be less than $6.9 \times 10^{-9}$ m$^2$/sec., preferably less than $6.9 \times 1^{-10}$ m$^2$/sec. and most preferably less than $6.9 \times 10^{-11}$ m$^2$/sec. To control the shape of the dots created, one can choose a blend of two or more resins each of which can have a different oxygen diffusion coefficient when dried or cured alone.

The barrier membrane should be as thin as possible, consistent with the structural needs for handling of the film and the film/photopolymer plate combination. Barrier membrane thicknesses between about 0.5 and 100 microns are preferred, with thickness of between about 1 and about 10 microns being most preferred.

The barrier membrane needs to have a sufficient optical transparency so that the membrane will not detrimentally absorb or deflect the actinic radiation used to expose the photosensitive printing blank. As such it is preferable that the barrier membrane have an optical transparency of at least 50%, most preferably at least 75%. To control the shape of the dots created, one can choose a blend of two or more resins each of which can have a different optical transparency when dried or cured alone.

The barrier membrane may be laminated to the surface of the printing plate using pressure and/or heat in a typical lamination process. As discussed above, the barrier membrane may be laminated to the photocurable layer prior to the imaging and exposing steps or laminated to the laser ablatable mask layer after the imaging step but before the exposure step. In the alternative, the bather membrane may be formed by coating and then drying or curing the blend of resins.

After the photosensitive printing blank is exposed to actinic radiation as described herein, the printing blank is developed to reveal the relief image therein. Development may be accomplished by various methods, including water development, solvent development and thermal development, by way of example and not limitation.

Finally, the relief image printing element is mounted on a printing cylinder of a printing press and printing is commenced.

EXAMPLES

Example 1

A barrier membrane was prepared comprising 100% polyvinyl butyral resin (Butvar® B-90, available from Solutia, Inc.).

The barrier membrane was laminated to an ablated Digital Max plate, (available from MacDermid Printing Solutions) to create a photosensitive printing blank. The photosensitive printing blank was then imaged, exposed and developed to reveal the relief image.

FIG. 1 depicts a scanning electron microscope (SEM) photograph of dots processed in accordance with Example 1 (i.e., a barrier layer comprising 100% polyvinyl butyral resin).

As can be seen from FIG. 1, the use of a barrier membrane comprising 100% polyvinyl butyral resin produced printing dots having a nice column shape but that lack the desired edge definition.

Example 2

A barrier membrane comprising a ratio of 1:4.4 of shellac resin to polyvinyl butyral resin (Butvar® B-90, available from Solutia, Inc.) was prepared.

The barrier membrane was laminated to an ablated Digital Max plate, (available from MacDermid Printing Solutions) to create a photosensitive printing blank. The photosensitive printing blank was then imaged, exposed and developed to reveal the relief image.

Figure 2:
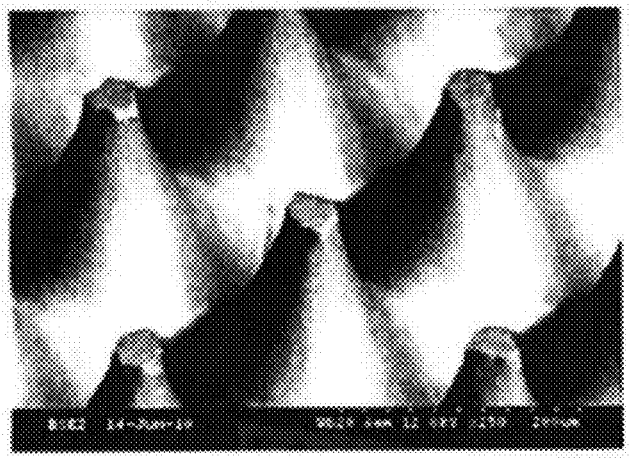
FIG. 2 depicts a SEM photograph of dots processed with a barrier layer in accordance with the present invention comprising a ratio of 1:4.4 of shellac resin to polyvinyl butyral resin.

FIG. 2 depicts a SEM photograph of dots processed in accordance with Example 2 (i.e., a barrier layer comprising a ratio of 1:4.4 of shellac resin to polyvinyl butyral resin).

As can be seen from FIG. 2, the use of a barrier membrane comprising a blend of polyvinyl butyral resin and shellac in the specified ratio produced printing dots having a suitable shoulder angle and with improved edge definition.

Example 3

A barrier membrane comprising a ratio of 4.8:1 of shellac resin to polyvinyl butyral resin (Butvar® B-90, available from Solutia, Inc.) was prepared.

The barrier membrane was laminated to an ablated Digital Max plate, (available from MacDermid Printing Solutions) to create a photosensitive printing blank. The photosensitive printing blank was then imaged, exposed and developed to reveal the relief image.

Figure 3:
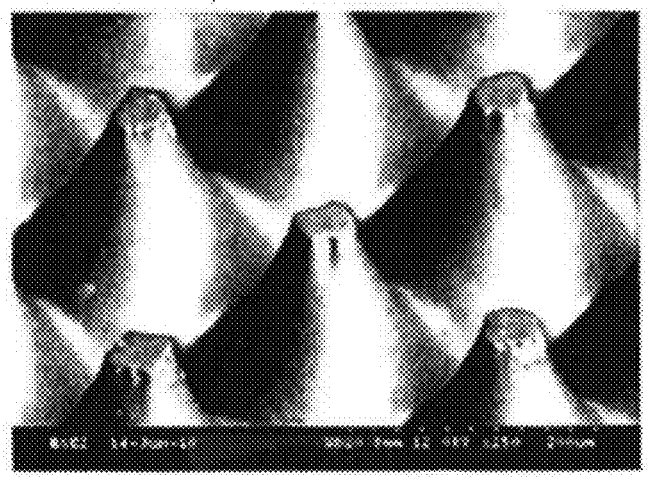
FIG. 3 depicts a SEM photograph of dots processed with a barrier layer in accordance with the present invention comprising a ratio of 4.8:1 of shellac resin to polyvinyl butyral resin.

FIG. 3 depicts a SEM photograph of dots processed in accordance with Example 3 (i.e., a barrier layer comprising a ratio of 4.8:1 of shellac resin to polyvinyl butyral resin).

As can be seen from FIG. 3, the use of a barrier membrane comprising a blend of polyvinyl butyral resin and shellac in the specified ratio produced printing dots with broader shoulder angles than in Example 2 and with similar edge definition.

Example 4

A barrier membrane comprising a ratio of 1.1:1 of shellac resin to polyvinyl butyral resin (Butvar® B-90, available from Solutia, Inc.) was prepared.

The barrier membrane was laminated to a to an ablated Digital Max plate, (available from MacDermid Printing Solutions) to create a photosensitive printing blank. The photosensitive printing blank was then imaged, exposed and developed to reveal the relief image.

Figure 4:
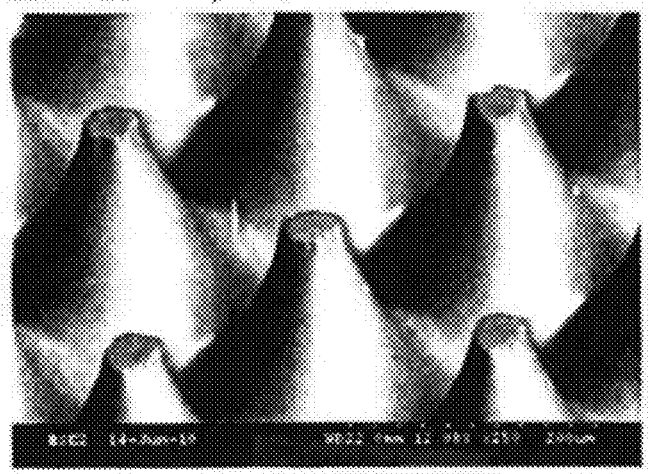
FIG. 4 depicts a SEM photograph of dots processed with a barrier layer in accordance with the present invention comprising a ratio of 1.1:1 of shellac resin to polyvinyl butyral resin.

FIG. 4 depicts a SEMI photograph of dots processed in accordance with Example 4 (i.e., a barrier layer comprising a ratio of 1.1:1 of shellac resin to polyvinyl butyral resin).

As can be seen from FIG. 4, the use of a barrier membrane comprising a blend of polyvinyl butyral resin and shellac in the specified ratio produced printing dots with broader shoulder angles than in Examples 2 and 3 and with similar edge definition.

Example 5

A barrier membrane was prepared comprising 100% shellac resin.

The barrier membrane was laminated to an ablated Digital Max plate, (available from MacDermid Printing Solutions) to create a photosensitive printing blank. The photosensitive printing blank was then imaged, exposed and developed to reveal the relief image.

Figure 5:
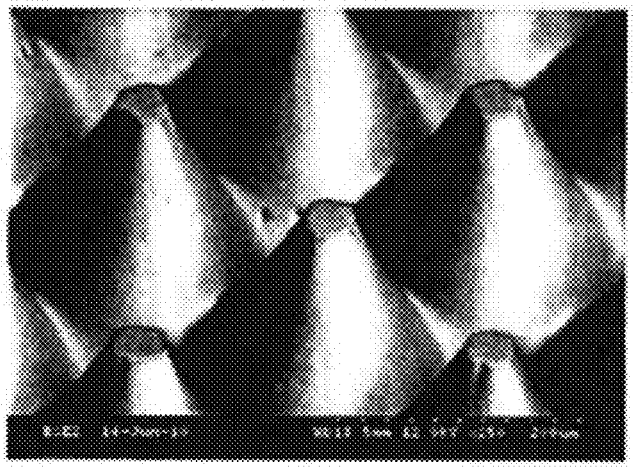
FIG. 5 depicts a SEM photograph of dots processed with a barrier layer in accordance with the present invention comprising 100% shellac resin.
Figure 6:
FIG. 6 depicts rounded edges on a 5% flexo dot wherein the entire dot surface is rounded.
Figure 7:
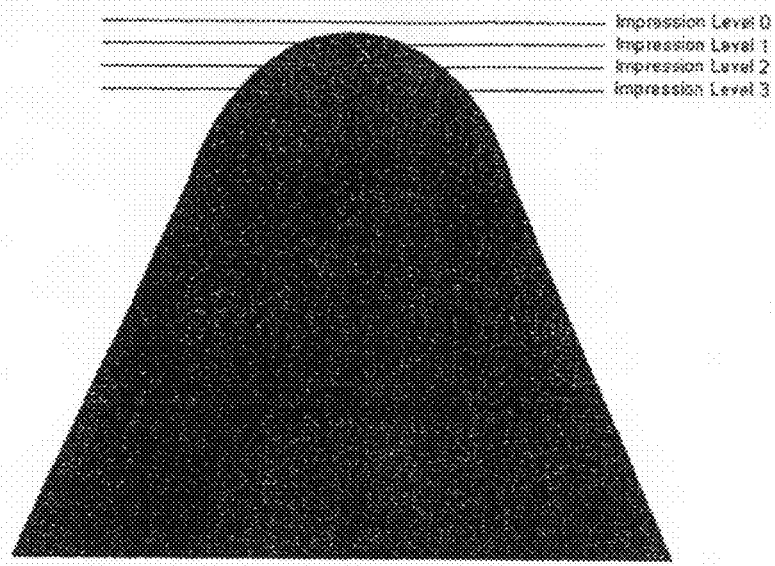
FIG. 7 depicts a diagram of increasing contact patch size with impression on a dot with a non-planar top.

FIG. 5 depicts a SEM photograph of dots processed in accordance with Example 5 (i.e., a barrier layer comprising 100% shellac resin).

As can be seen from FIG. 5, the use of a barrier membrane comprising 100% shellac resin produces dots with a very sharp edge but with larger shoulder angles.

Thus, it can be seen that the method of making the relief image printing element described herein produces a relief image printing element having a relief pattern comprising relief dots to be printed that are configured for optimal print performance. In addition, through the platemaking process described herein, it is possible to manipulate and optimize certain geometric characteristics of the relief dots in the resulting relief image.

Example 6

A barrier membrane comprising a ratio of 1:2.1 of shellac resin to polyvinyl butyral resin (Butvar® B-90, available from Solutia, Inc.) was prepared.

The barrier membrane was laminated onto a carbon black layer which in turn was laminated onto a photocurable layer, thus creating a barrier layer between the photocurable layer and the carbon mask layer. The photosensitive printing blank was then ablated, exposed and developed to reveal the relief image.

Figure 11:
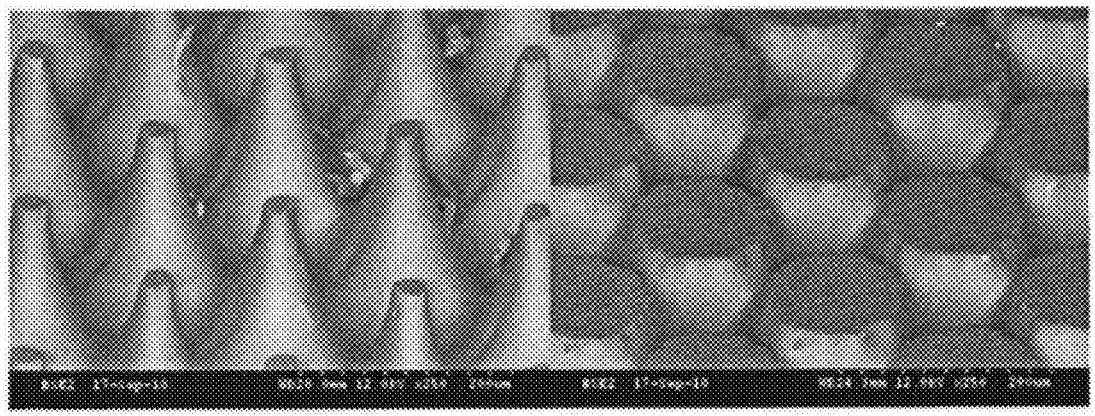
FIG. 11 depicts a SEM photograph of 3% and 50% dots processed as described in Example 6.

FIG. 11 depicts a SEM photograph of 3% and 50% dots processed in accordance with Example 6 (i.e., a harrier layer comprising a ratio of 1:2.1 of shellac resin to polyvinyl butyral resin).

As can be seen from FIG. 11, the use of a barrier membrane comprising 1:2.1 of shellac resin to polyvinyl butyral resin produced printing dots having high shoulder angles and good edge definition.

Example 7

A barrier membrane comprising a ratio of 1.1:1 of shellac resin to polyvinyl butyral resin (Butvar® B-90, available from Solutia, Inc.) was prepared.

The barrier membrane was laminated onto a carbon black layer which in turn was laminated onto a photocurable layer, thus creating a barrier layer between the photocurable layer and the carbon mask layer. The photosensitive printing blank was then ablated, exposed and developed to reveal the relief image.

Figure 12:
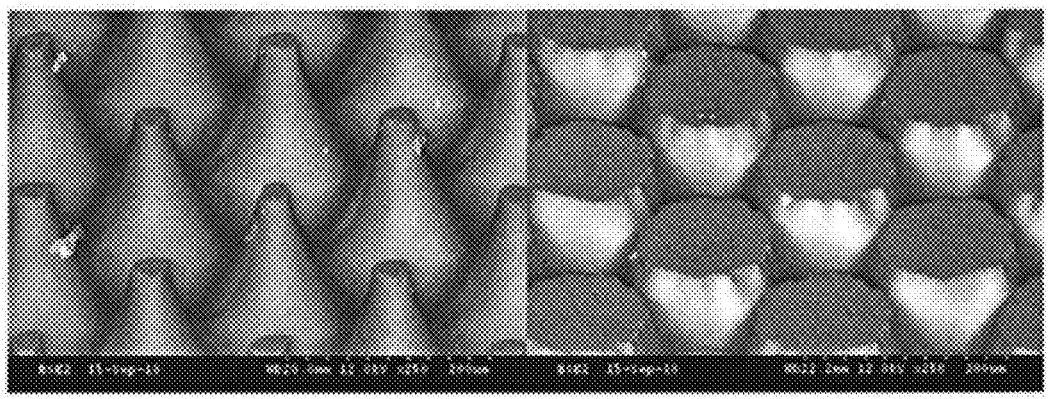
FIG. 12 depicts a SEM photograph of and 50% dots processed as described in Example 7.

FIG. 12 depicts a SEM photograph of 3% and 50% dots processed in accordance with Example 7 (i.e., a barrier layer comprising a ratio of 1:2.1 of shellac resin to polyvinyl butyral resin).

As can be seen from FIG. 12, the use of a barrier membrane comprising 1.1:1 of shellac resin to polyvinyl butyral resin produced printing dots having lower shoulder angles than those produced by the barrier membrane described in Example 6.

What is claimed is:

1. A method of controlling the shape of a plurality of relief dots created in a photosensitive printing blank during a digital platemaking process, said photosensitive printing blank comprising a laser ablatable mask layer disposed directly or indirectly above at least one photocurable layer, the method comprising the steps of:
   a) laser ablating the laser ablatable mask layer to create an in situ negative in the laser ablatable mask layer;
   b) applying a barrier membrane to the in situ negative wherein the barrier membrane comprises at least two resins;
   c) exposing the at least one photocurable layer to actinic radiation through the in situ negative; and
   d) developing the imaged and exposed photosensitive printing blank to reveal the relief image therein, said relief image comprises the plurality of relief dots;
   wherein the shape of the relief dots is tailored or altered by altering the type and ratio of the at least two resins,
   whereby the relief dots have at least one geometric feature selected from a planarity of a top surface of the relief dots, a shoulder angle of the relief dots and an edge sharpness of the relief dots.

2. The method according to claim 1, wherein the barrier membrane comprises at least two resins selected from the group consisting of polyvinylpyrrolidone resin, shellac resin, polyvinyl butyral resin, polyvinylidene chloride polymers, vinyl chloride copolymers and combinations of the foregoing.

3. The method according to claim 2, wherein the barrier membrane comprises shellac resin and polyvinyl butyral resin.

4. The method according to claim 1, wherein the barrier membrane comprises at least two resins wherein one resin has an optical transparency of from 50% to 100% alone and another resin has an optical transparency of 50% to 100% alone.

5. The method according to claim 1, wherein one resin has an oxygen diffusion coefficient of less than $6.9 \times 10^{-9}$ m$^2$/sec alone and another resin has an oxygen diffusion coefficient of less than $6.9 \times 10^{-9}$ m$^2$/sec alone.

6. The method according to claim 2, wherein the glass transition temperature of the polyvinyl butyral resin is between about 62 to 78° C.

7. The method according to claim 1, wherein the barrier membrane has an oxygen diffusion coefficient of less than about $6.9 \times 10^{-9}$ m$^2$/sec.

8. The method according to claim 1, wherein the shoulder angle of the relief dots is greater than 50°.

9. The method according to claim 8, wherein the shoulder angle of the relief dots is greater than about 70°.

10. The method according to claim 1, wherein the edge sharpness of the relief dots, defined as a ratio of the radius of curvature at the intersection of the shoulder and a top of the relief dot ($r_e$) to the width of the dot's top or printing surface (p) is less than 5%.

11. The method according to claim 10, wherein the ratio of $r_e$:p is less than 2%.

12. The method according to claim 1, wherein the barrier membrane has a thickness of between about 0.5 and about 100 microns.

13. The method according to claim 1, wherein the barrier membrane has an optical transparency of between about 50 and about 100%.

14. The method according to claim 1, wherein at least one of the resins comprises at least one of polyvinylpyrrolidone or shellac resin.

15. A method of controlling the shape of a plurality of relief dots created in a photosensitive printing blank during a digital platemaking process, said photosensitive printing blank comprising a laser ablatable mask layer disposed directly or indirectly above at least one photocurable layer, the method comprising the steps of:
   a) laser ablating the laser ablatable mask layer to create an in situ negative in the laser ablatable mask layer;
   b) applying a barrier membrane to the photosensitive printing blank wherein the barrier membrane comprises at least two resins;
   c) exposing the at least one photocurable layer to actinic radiation through the in situ negative; and
   d) developing the imaged and exposed photosensitive printing blank to reveal the relief image therein, said relief image comprises the plurality of relief dots;
   wherein the foregoing steps do not need to be performed in the stated order, and wherein the at least two resins comprise shellac resin and polyvinyl butyral resin.

* * * * *